(12) United States Patent
Fritzsche

(10) Patent No.: US 7,107,173 B2
(45) Date of Patent: Sep. 12, 2006

(54) AUTOMATIC TEST EQUIPMENT OPERATING ARCHITECTURE

(75) Inventor: William A. Fritzsche, Morgan Hill, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/888,863

(22) Filed: Jul. 9, 2004

(65) Prior Publication Data

US 2005/0171722 A1 Aug. 4, 2005

Related U.S. Application Data

(60) Provisional application No. 60/541,550, filed on Feb. 3, 2004.

(51) Int. Cl.
*G06F 19/00* (2006.01)

(52) U.S. Cl. ......................... 702/122; 714/25

(58) Field of Classification Search ................ 702/122, 702/117–118, 182–185; 714/1, 25
See application file for complete search history.

(56) References Cited

U.S. PATENT DOCUMENTS

2004/0225952 A1* 11/2004 Brown et al. ................ 714/819

\* cited by examiner

*Primary Examiner*—Edward Raymond
(74) *Attorney, Agent, or Firm*—Dorsey & Whitney LLP

(57) ABSTRACT

An integrated circuit testing device, such as an ATE, configured with an architecture comprising a distinct software layer and a distinct hardware layer with an interface for tester abstraction providing a communication conduit between the software layer and the hardware layer. The software layer communicates in device under test terms whereas the hardware layer communicates in the terms of the testing apparatus. Various communication interface points are provided to the software and hardware layers, as well as the interface for tester abstraction.

5 Claims, 7 Drawing Sheets

(BACKGROUND)

AUTOMATIC TEST EQUIPMENT OPERATING ARCHITECTURE

CROSS REFERENCE TO RELATED APPLICATIONS

This application is a non-provisional application claiming priority to provisional application 60/541,550 titled "Software Framework for Open Architecture ATE" filed on Feb. 3, 2004, which is hereby incorporated by reference herein.

FIELD OF THE INVENTION

This invention relates generally to an automatic test equipment employing an open architecture software framework and methods related thereto.

BACKGROUND OF THE INVENTION

FIG. 1 (Background) is a block diagram illustrating an automatic test equipment ("ATE") 10 coupled with an integrated circuit 12. The fundamental task of an ATE is to test and characterize the functionality of integrated circuits. An ATE is typically a powerful computing platform. Generally speaking, testing an integrated circuit or "chip", which during a test is referred to as a device under test or "DUT," involves applying a stimulus, often digital and in the form of a series of logic 1's and 0's, to one or more input pins of the DUT. When the DUT is an analog device, the stimulus applied to the inputs and the expected response are analog and are typically represented by waveforms of varying amplitude or frequency. The DUT generates an output, also typically in the form of a series of logic 1's and 0's, from one or more output pins. The output is captured by the ATE and compared with the expected output to produce test results 14. Characterizing a DUT, in contrast, involves identifying how the DUT reacts to variations in parameters, such as clock speed, voltage levels, and temperature.

Typically, an ATE 10 is physically located at an integrated circuit fabrication facility or "fab." Purchase of an ATE is a relatively expensive capital equipment expenditure. As such, many fabricators do not dedicate an ATE to testing one particular type of chip, but instead deploy it to test and characterize many different types of chips that each require unique test and characterization routines. Test engineers or other personnel may run tests and characterize some or all of the chips being produced at the fabrication facility.

As new integrated circuits are developed with new features, a fabricator typically attempts to use an existing ATE to test and characterize the new chip. In many instances, the ATE vendor develops new hardware, sometimes referred to as instruments or pin electronics, to interface with the new integrated circuit and allow the ATE to conduct the desired tests. Conventionally, the ATE vendor also has to develop and deploy new software to communicate with the new hardware. It is often time consuming and difficult to adapt existing ATE to the new functionality. One additional problem that often occurs with conventional ATE's involves the difficulty in ensuring that existing test routines for chips being fabricated, perhaps for years, are able to run properly. Oftentimes, the existing routines must be modified and debugged at considerable time and expense to conform with the new software or hardware releases.

Aspects of the present invention provide a software framework or operating system deployable in an ATE that facilitate use of the ATE in testing many different chips, quick and easy reconfiguration of a test or characterization routine to focus on testing of a particular trouble spot for a chip, modularity, test release independence to ease of updating or reconfiguring the ATE to add new features, which might involve adding or upgrading software subroutines and adding or upgrading hardware of the ATE.

SUMMARY OF THE INVENTION

Aspects of the present invention involve an automatic testing equipment, or other integrated circuit testing device, comprising a runtime software layer comprising indications of DUT pin information, the runtime software layer communicating in device under test terms. The ATE further includes a runtime hardware layer comprising indications of ATE instrument information, the runtime hardware layer communicating in automatic test equipment hardware terms. Finally, the ATE includes an interface, or ITA, for translating the device under test terms from the runtime software layer to the automatic test equipment hardware terms of the runtime hardware layer.

The ATE may include several access points, including a common access port in communication with the runtime software layer, a hardware register interface in communication with the runtime hardware layer, a CORBA interface in communication with the common access port, the interface for tester abstraction, and the hardware register interface, a java native interface in communication with the common access port, the interface for test abstraction, and the hardware register interface.

The runtime software area comprises at least one language object, at least one controller object, and at least one features object. The runtime hardware area comprises at least one area controller and at least one instrument driver. The ITA may comprise a DC-levels interface, an analog interface, a connection interface, an alarm interface, a trigger interface, a timing interface, a capture interface, and a pattern interface.

In another aspect of the invention, a method of controlling an automatic test equipment comprises receiving a block definition of an automatic test equipment instrument in device under test terms, the block definition comprising at least one indication of a parameter of the automatic test equipment instrument; translating the device under test terms to automatic test equipment instrument terms; and programming the automatic test equipment instrument in accordance with the block definition.

The method may additionally comprises the operation of parsing the block definition. After which, the method may comprise resolving the block definition. The method may include translating the resolved block information to an identification of the automatic test equipment instrument, translating the resolved block information to instrument term values, programming the automatic test equipment instrument in accordance with the instrument term values. Generally, the ATE may command the automatic test instrument to apply a stimulus to the device under test; and receiving a response from the device under test. Finally, the ATE may perform the operation of comparing the response from the device under test with an expected response for the device under test.

DETAILED DESCRIPTION OF EMBODIMENTS OF THE INVENTIONS

Aspects of the present invention involve a framework for a software operating system for an ATE. An ATE configured in accordance with the present invention is architecturally divided between areas responsive to the IC being tested, i.e., the DUT, and areas responsive to the interfaces with the IC, i.e., the ATE and its instruments. Configured in such a manner, each area is separately accessible, upgradeable, reconfigurable, and the like, with little or no direct impact on the other areas. As such, the ATE may be efficiently configured to operate with new ICs, while maintaining operation with existing ICs, as well as new instruments, and test and characterization routines.

Figure 1:
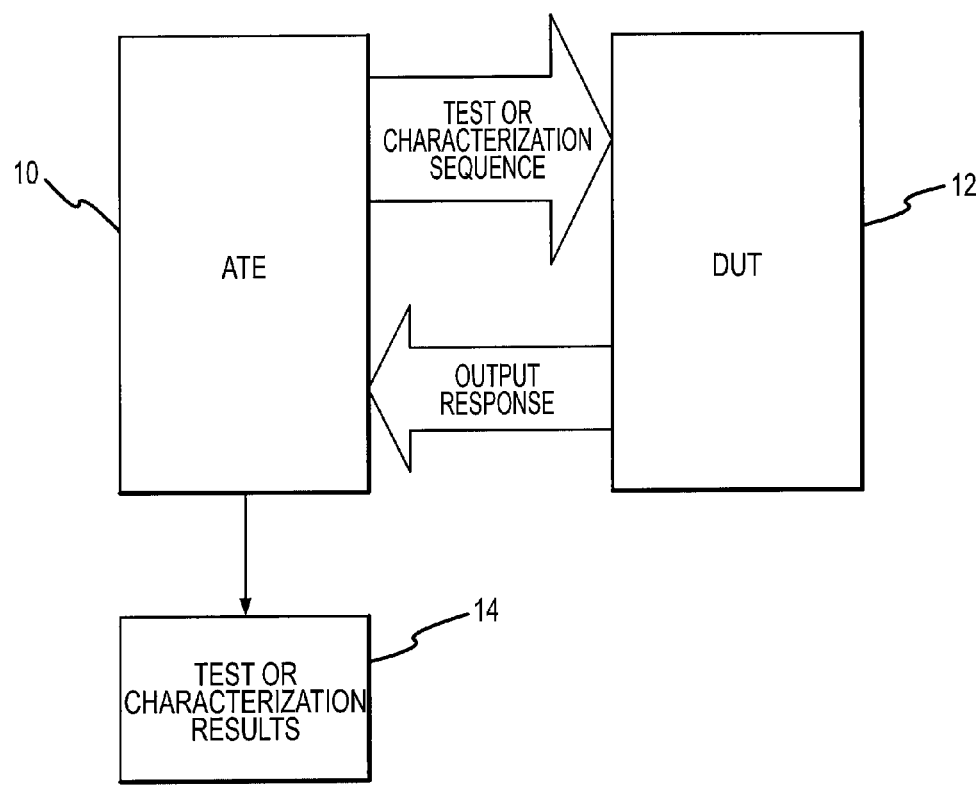
FIG. 1 (Background) is a block diagram illustrating the interaction between automatic testing equipment and a device under test to produce test or characterization results.
Figure 2:
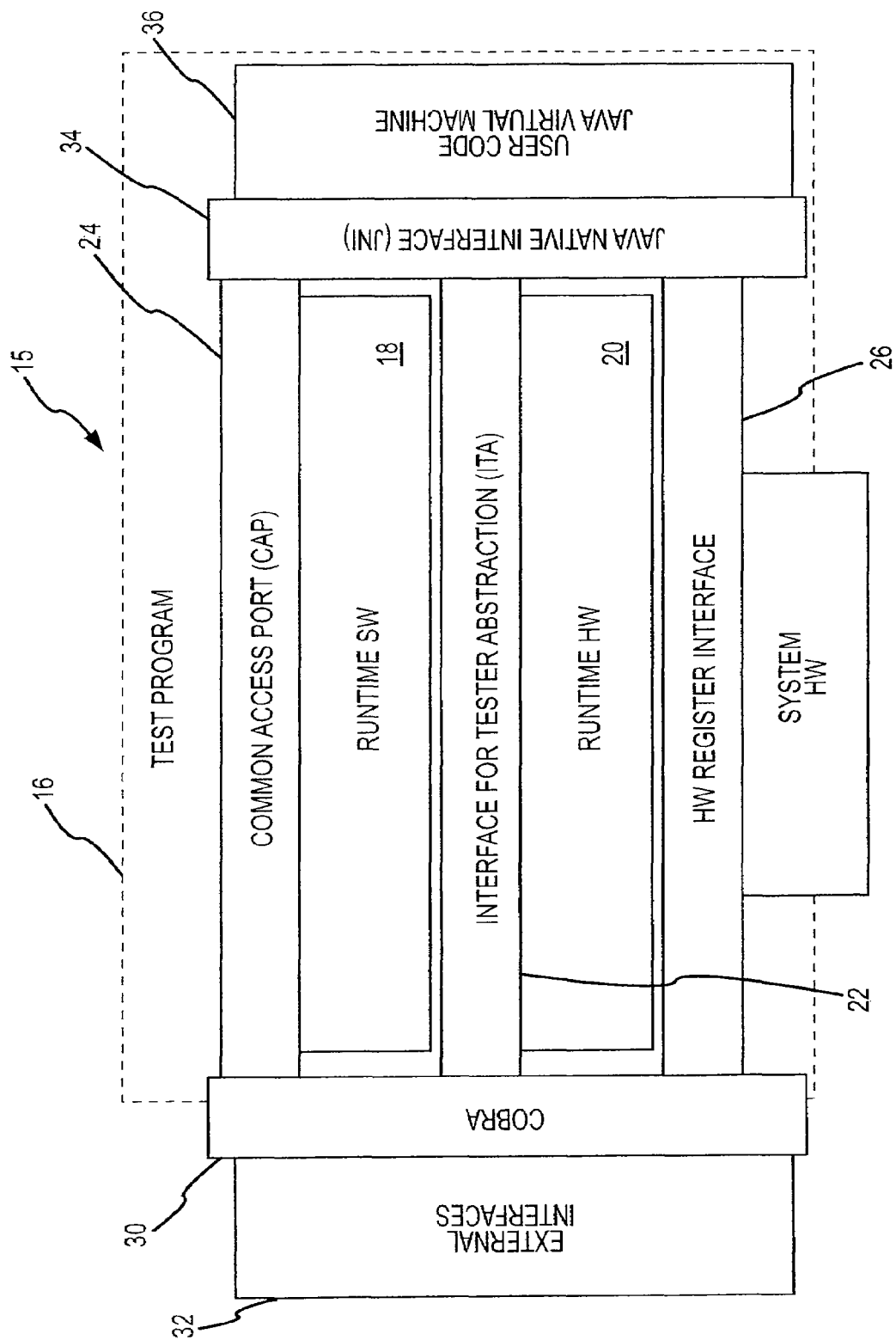
FIG. 2 is a software diagram illustrating a software architetecture, in accordance with one embodiment of the present invention.

FIG. 2 is a software architectural diagram illustrating one particular software framework 15, in accordance with the present invention. The software framework is adapted to run a test program 16 that controls the ATE application of the input stimulus to the DUT and receipt and processing of the output sequence from the DUT. Further, the test program controls the application of the comparison between the actual response and the expected response of the DUT. The framework comprises a runtime software area 18 and a runtime hardware area 20, each separately accessible and configured to operate in separate areas. An interface for tester abstraction 22 provides a communication pathway between the routine software area and the runtime hardware area, and further provides an abstract separation between the areas.

An ATE communicates with a DUT through a device typically referred to as an "instrument." An ATE instrument generally has one or more logic connections adapted to apply the stimulus to one or more input pins of a DUT and has one or more logic connections adapted to receive the output sequence and perform the comparison operation. The runtime software area 18 provides the infrastructure to define the input sequences applied to the DUT. For example, through the runtime software area, the user may establish input voltage levels, test pattern timing, and the like. The runtime hardware area 20 provides the infrastructure to program, drive, and configure the ATE instruments that provide the connections with the DUT.

The runtime software area 18 is responsive to device or DUT terms. The runtime hardware area 20, on the other hand, is responsive to tester or ATE terms. As used herein, the term "DUT term" includes logical constructs in terminology associated generally with a DUT or some portion thereof. In contrast, as used herein, the term "ATE term" includes logical constructs in terminology associated generally with an ATE or an instrument thereof. By logically separating the architecture and its control over the ATE, a user familiar with a particular IC may devise a test scenario in the terms of the IC. For example, the user may communicate with ATE by referring to pins of the IC and logic voltage levels associated therewith. The runtime hardware area communicates with the instrument that will physically stimulate the appropriate pins at the associated voltage levels. The user need not know the particulars of the instrument, as he may communicate in terms of the IC.

The runtime software 18 and hardware areas 20 communicate via the interface for tester abstraction ("ITA") 22. One function of the ITA is to provide a translation between DUT terms of the runtime software layer and the ATE terms of the runtime hardware layer. Unlike conventional ATE operating system frameworks, in one embodiment of the invention, the runtime software area is substantially distinct from the runtime hardware area. The ITA provides the interface to translate between DUT terms and ATE terms.

Still referring to FIG. 2, the software framework 15 defines several interface boundaries. To access the runtime software area, the software framework comprises a common access port ("CAP") interface 24. For the runtime hardware area to communicate with the ATE system hardware 28, the framework comprises a hardware register interface 26 providing communication between the runtime hardware area and the ATE system hardware. Further, the framework comprises a common object request broker architecture ("CORBA") interface 30 providing a communication pathway between various external interfaces 32 and the runtime software and runtime hardware areas, either directly or via one of the CAP interface, the ITA, or the HW register interface. Generally speaking, CORBA is an object management group specification which provides a standard messaging interface between distributed objects. CORBA includes an interface definition language ("IDL") and a dynamic invocation interface ("DII"). Through the IDL, CORBA may be mapped to a number of languages including C, C++, Java, and Python. Additionally, the software framework comprises a Java Native Interface ("JNI" 34) providing a communication pathway between a user code area 36 (also referred to as a test template area) and the runtime software and runtime hardware areas, either directly or via one of the CAP interface, the ITA, or the HW register interface. Preferably, the interface boundaries and other aspects of the framework are deployed in accordance with object oriented analysis/design ("OOA/D").

Figure 3:
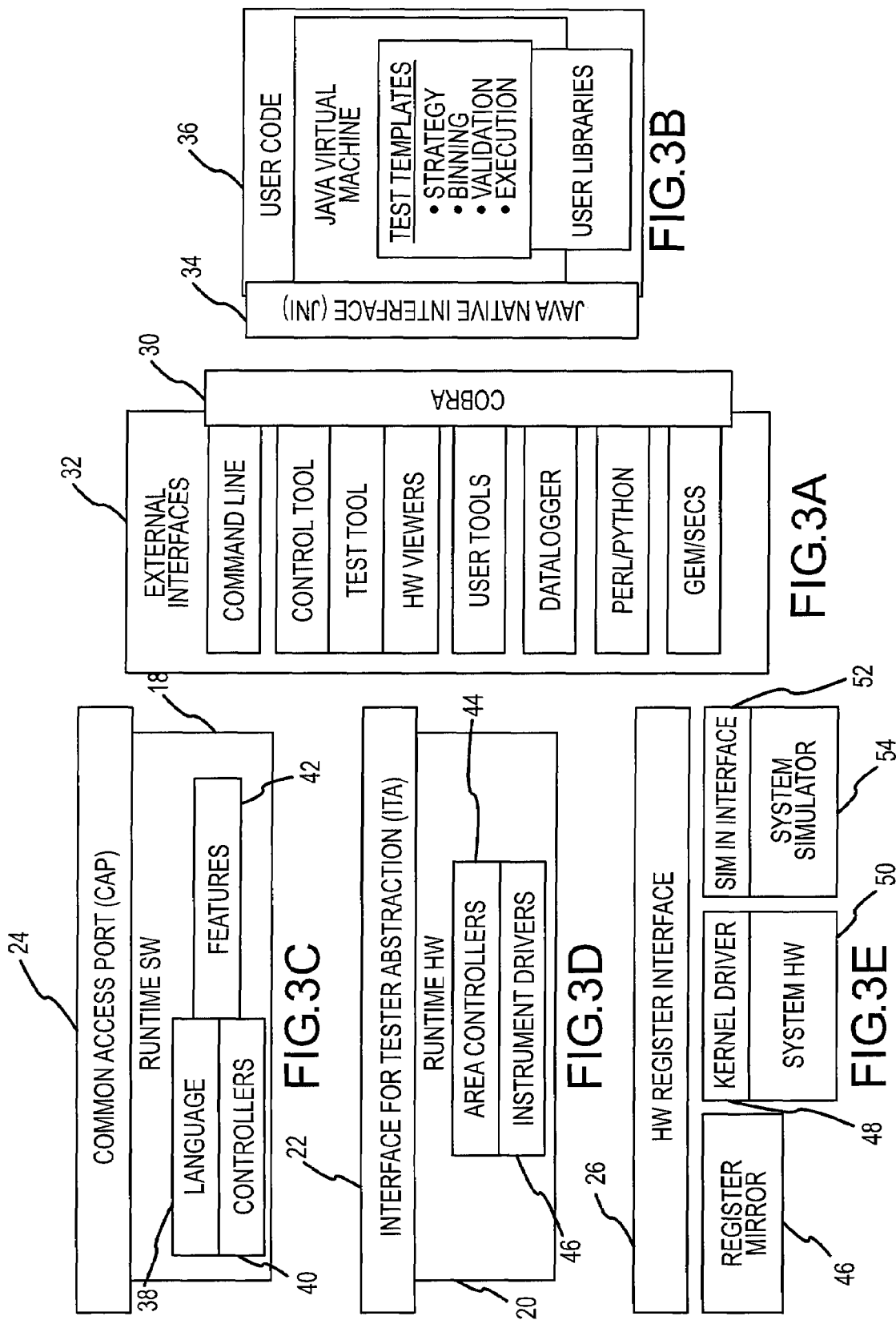
FIG. 3A is a software diagram illustrating some particular features of an external interface portion of the software architecture, in accordance with one embodiment of the present invention.
FIG. 3B is a software diagram illustrating some particular features of a user code portion of the software architecture, in accordance with one embodiment of the present invention.
FIG. 3C is a software diagram illustrating some particular features of a runtime software portion of the software architecture, in accordance with one embodiment of the present invention.
FIG. 3D is a software diagram illustrating some particular features of a runtime hardware portion of the software architecture, in accordance with one embodiment of the present invention.
FIG. 3E is a software diagram illustrating some particular features of a hardware register interface portion of the software architecture, in accordance with one embodiment of the present invention.

FIG. 3A is a software diagram of one particular implementation of the external interface module 32. The external interface module involves processes external to the test program. As shown in FIG. 3, the software framework 15 may support various external interfaces, such as a command line interface, a control tool interface, a test tool interface, a hardware viewer interface, a user tool interface, a datalogger interface, a perl/pyhthon interface, and a Gem/Secs interface. The external interfaces communicate with the CAP interface 24, ITA 22, and HW register interface 26 via the CORBA interface 30. In this implementation, CORBA is deployed as the interface technology to provide scripting, command line, and network accessibility of the interface.

FIG. 3B is a software diagram of one particular implementation of the user code module 36. The user code area is provided, in one example, in accordance with Java Virtual Machine ("JVM") programming specifications, which interprets Java programs. As is known, JVM supports object-oriented programming directly by including instructions for object method invocation. The user code module provides the environment where the user code (test templates) run, based on the Java language. As used herein, the term "test template" refers to organization, control, validation and other functions to manage execution of a sequence of instructions meant to execute a particular sequence of stimulus on one or more DUT pins. The Java language is employed, in one example, to support user developed code that is independent from changes to the system hardware or software, which allows an ATE employing an architecture in accordance with the invention to be updated or modified to run new software testing or characterization routines as well as deploy new hardware and instruments for new testing new or existing chips with little or no modification of existing test and characterization routines. The Java feature of dynamic runtime binding provides, in part, this capability.

Test templates exist within the user code module. In one implementation, test templates are divided into several capabilities, including: strategy control to provide specialized test control needed for parallel device testing, binning control to allow customization for the specific device binning requirements, test validation to validate the test setup and usage against the system capabilities, test execution control to provide customization of the device test methods and sequencing, and user library support for common tasks. The user code module further includes standard test template implementations that can be customized by the user to suit their specific needs.

FIG. 3C is a software diagram illustrating the runtime software ("runtime SW") module 18. The runtime software area implements the CAP interface 24 and provides tester independent system support. The runtime software module is sub-divided into three major areas, in one example. The first area of the runtime software module includes language objects 38 that provide a platform for test definition. Test definition blocks are defined in eXtended Markup Language ("XML"). XML was chosen for its easy definition, parsing and the availability of standard tools. Language objects are sub-classed from a "Generic Block" interface. The second area of the runtime software module includes controller objects 40 that operate on the language objects to define and control the test program. Controller objects implement the runtime interpretation of the language blocks to allow efficient runtime operation. Finally, the third area of the runtime software module include feature objects 42 that implement capabilities needed for test program control, datalogging, debugging, etc., which are not directly related to the language objects. Examples of feature objects are: test program controller, flow controller, datalog controller, equation engine, and test controller.

In one implementation, the runtime software layer 18 is hardware independent. On the other hand, the runtime hardware layer 20 is tester hardware dependent. With hardware dependencies separated between the runtime software layer and the hardware layer, new hardware may be added to the system without impact on existing runtime software layer objects. At the software layer, support for new hardware is achieved by plugging in new language, controller and feature objects to support the new hardware.

As shown in FIG. 3C and as discussed above, the runtime software module is accessed with the CAP interface 24. The CAP interface to the runtime SW area provides two types of access capabilities, synchronous data access and asynchronous interaction, which are divided in sub-areas. First, synchronous data access or "set/get" provides generic block access to allow access to all the data within language objects. Further, synchronous data access includes generic object access to allow access to the runtime objects associated with a feature area. One example of a synchronous data access routine is:

myTimBlock=cap.getBlock ("Timing", myBlockName);
myPeriodSection=myTimBlock.getSection ("Periods");

Second, asynchronous interaction or "push/broadcast" includes a datalog interface that pushes data to the designated outputs as it is created. The datalog system is implemented in the feature area, with a generic object interface to provide producer/consumer registration and runtime controlled enabling of log data. Further, aynchronous interaction includes a tool interaction registration system that provides a change notification service for data within the generic block and generic object areas.

FIG. 3D is a software diagram of one example of the runtime hardware module 20, in accordance with one aspect of the present invention. The runtime hardware module implements the ITA interface 22 and provides tester dependent system support. One or more area controllers 44 provide a functional breakdown of the abstract capabilities provided in the tester into separate areas. Each area implements an abstract model definition for the ITA. This provides isolation from the specific hardware implementation. Instrument drivers 46 implement translations from the abstract model to hardware implementation for each area supported by the specific hardware implementation. The configuration and resource controllers include hardware power-up and initialization for: slot/instrument identification; instrument driver loading; bus resource assignment/allocation; user defined resource grouping and naming; and, the ITA.

The ITA 22 provides synchronous data access to the instrument. The ITA is implemented, in one example, with a generic interface class that is inherited by each area and instrument driver. The interface provides the following types of capabilities: getarea ("areaToken") to allow hierarchical traversal of the tester functionality; listCapabilities("areaToken") to provide a list of the available tokens for the given area; and, setX/getX for data access to a group of HW resources for a given capability (token) for X types, such as Integer, Double, Float, Token, BitArray, etc.

Two examples of specific capability provided by the ITA, are:

myPinLevels=Ita.getArea ("Levels/PE");
myPinLevels.setD ("busPins", "VIH", 1.5);

Referring again to FIGS. 2 and 3E, the architecture 15 further includes a hardware interface module 26 providing access to the system hardware. FIG. 3E is a software diagram illustrating the hardware interface module in communication with a register mirror 46, a kernel driver 48, system hardware 50, a Sim interface 52 and system simulator 54. The architecture allows various hardware interfaces to be added to the system. Such an implementation allows simulation capability to be placed at this level, which is useful to support off-line development. This feature further allows the tester to support a test program development and driver check-out without using valuable tester time, as well as provide full HW hardware simulation capabilities with no architectural impact.

As illustrated in FIG. 2, the software architecture includes three interface points: the CAP interface 24 to provide top level access to the system, the ITA interface 22 to provide access to the tester using an abstract model interface, and the hardware register interface 26 to provide direct access to the hardware, needed for diagnostics, calibration, and system debug. In one particular implementation, the interfaces are implemented in IDL (Interface Definition Language) to provide a unified interface to the C++ object implementing the interface. IDL is a language which is compiled to provide various access capabilities.

Figure 4:
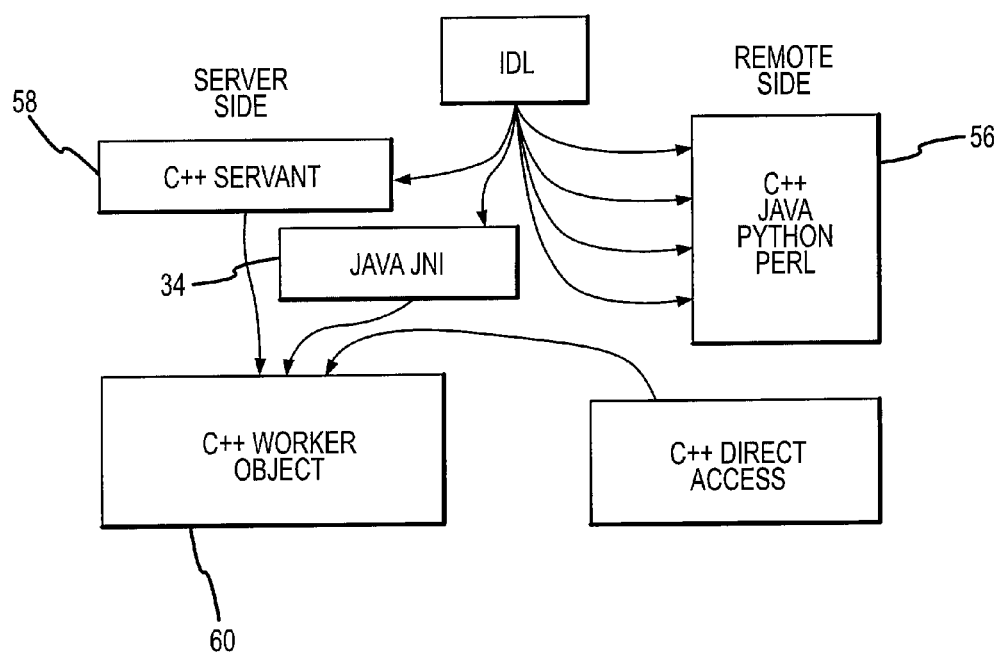
FIG. 4 is a software diagram illustrating one arrangement of access capabilities of an ATE employing a software architecture in accordance with one embodiment of the present invention.

FIG. 4 illustrates one particular implementation of the type of access capabilities provided by a system in accordance with the present invention. The access capabilities include: CORBA remote clients 56 to provide network access to various languages, CORBA server servant 58 to provide the bridge from CORBA to the C++ worker object 60, JNI 34 to provide access to the user code (test templates) which run within the JVM, and local C++ access for internal system usage made by directly calling the C++ worker object interface.

The CORBA technology used for the interface provides a unified API which is network accessible from any platform/language. Also, a portion of the interface definition is derived from the user-source block syntax for both block access and ITA access. In doing this, once the source definition is known, a large part of the API is also known. This helps make the system easier to use.

As mentioned above, many ATE include devices, often referred to as "instruments," that are used for the ATE to interact with the DUT. Instruments may be generally classified as a function of three DUT pin types. Namely, power supply, digital and analog DUT pin types. The term "pin" being meant to correlate with the type of DUT pin or resource that the instrument will be in communication with. For example, a power supply pin is used to provide the necessary power to the appropriate pins of a DUT in order to run the DUT during a test. Digital and analog instrument pins typically convey the digital or analog test stimulus, respectively, to the DUT and receive the response from the DUT.

Figure 5:
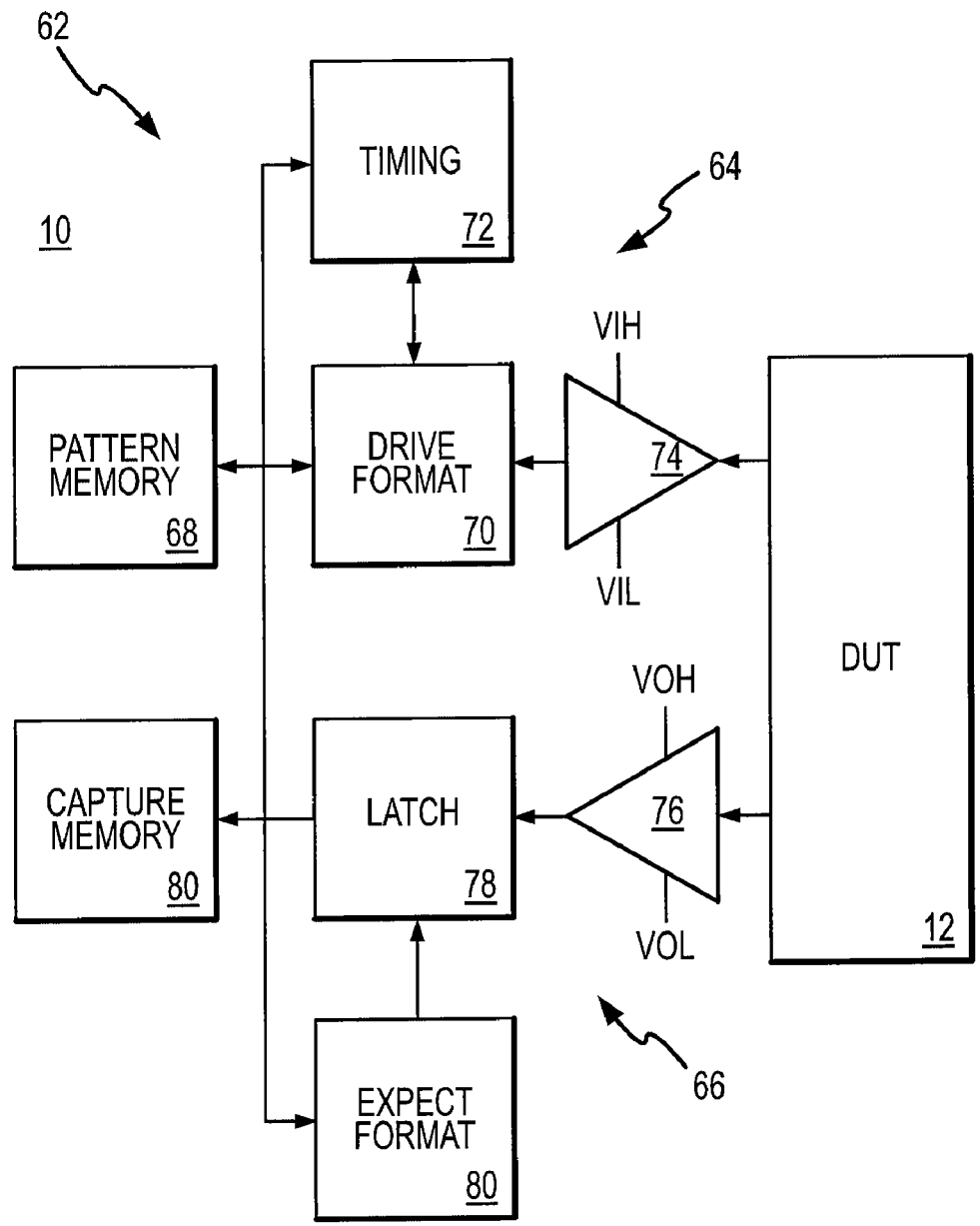
FIG. 5 is a block diagram illustrating an automatic testing equipment instrument configuration controllable by a software architecture, in accordance with one embodiment of the present invention.

FIG. 5 is a high level block diagram of one example of the electronics for one digital pin 62 of an instrument. Broadly speaking, the digital pin or "pin slice" includes an input channel 64 and an output channel 66. The input channel supplies the appropriate test pattern to the DUT 12, and the output channel receives and processes the output pattern generated by the DUT in response to the test pattern. The digital pin shown in FIG. 5 is meant to provide one example of an instrument that may be employed by an ATE operating a software framework conforming to the present invention. The pin instrument is not meant, however, to limit the scope of the present invention to this particular instrument, type of instrument, or limit the invention otherwise.

In the input channel 64, the digital pin instrument includes a pattern memory 68 for storing a test pattern to be applied to the DUT. The memory is in communication with a drive formatter 70, which translates the test pattern into the appropriate logic levels for the DUT. The drive formatter is also in communication with a timing block 72 that provides the appropriate timing for transmitting the test pattern to the DUT. The drive formatter transmit the properly formatted test pattern to a driver, such as a comparator 74 with VIH (Voltage Input High) and VIL (Voltage Input Low), which in turn transmits the test pattern, with proper voltage levels and timing, to the appropriate pin or pins of the DUT.

In the output channel 66, the digital pin instrument includes a comparator 76 with VOH (Voltage Output High) and VOL (Voltage Input Low) that receives the response from the DUT 12. The comparator transmits the response to a latch 78. The latch is in communication with the expected response formatter 80, which transmits the expected response to the latch in order to compare the actual DUT response with the expected response. The timing block 72 is also in communication with the expected response formatter to provide the appropriate timing for the expected response signal. The results of the comparison are transmitted and stored in the capture memory 80.

Referring again to FIGS. 2 and 3C, as mentioned above, the runtime software area 18 of the framework includes language objects 38, controller objects 40, and feature objects 42. Generally, language objects provide a means for defining test blocks. As will be discussed in more detail below, a test block provides a way for user to define an instrument or other hardware set with abstract constructs. Controller objects 40 operate on the language objects to define and control the test program. They implement the needed runtime interpretation of the language blocks to allow efficient runtime operation. The controller objects communicate with instruments via the ITA 22. Feature objects implement capabilities needed for test program control, datalogging, debugging, etc., which are not directly related to the language objects.

The runtime software area of the framework provides an abstract view of the system hardware, such as an instrument 62. For purposes of the runtime software, an instrument may be decomposed into abstract constructs and defined in device under test terms (e.g., the terms of the IC). For example, the runtime software may include a hierarchy of blocks, which provide a medium for the user to define the hardware set-up with abstract constructs. The blocks are further decomposed into device term definitions for setting up the hardware, such as an instrument, for a test. For example, device term definitions may include "levels" for user to define the voltage levels of the driver and the comparator, "pattern" for a user to define the test pattern for a DUT and the expected response pattern to compare to the actual response of the DUT, "timing" for a user to define the timing for applying the test pattern to the DUT and for comparing the expected response to the actual response from the DUT, etc.

At the software layer level the user defines the device layout in DUT terms as a function of a designation or name of each pin of the DUT. For example, DUT pin 1="CLK" and DUT pins 1–3="DBUS" or databus. Correspondingly, the software layer will include a CLK levels block and a DUT pin levels block. Through the levels block the user defines the voltage levels for the CLK and the databus pins.

Figure 6:
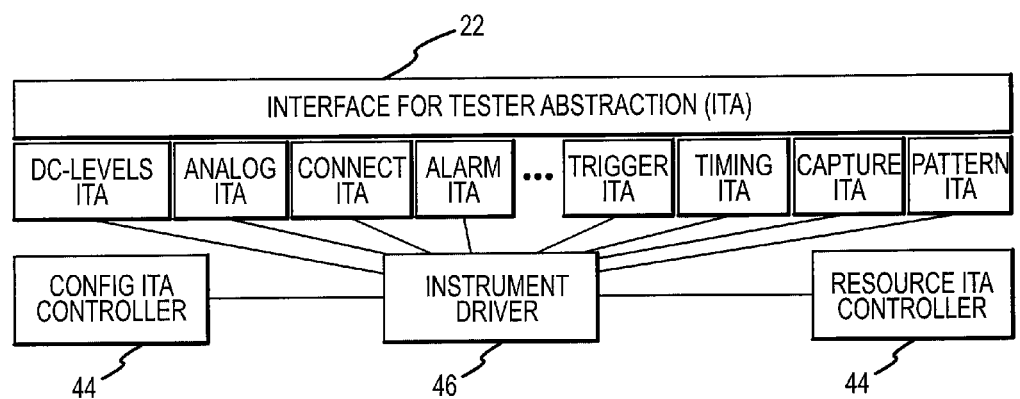
FIG. 6 is a software diagram illustrating some particular types of abstract interfaces of a software architecture provided in accordance with one embodiment of the present invention.

FIG. 6 is a block diagram illustrating one particular implementation of the ITA 22 and communication with the runtime hardware layer 20 of an ATE employing a software framework conforming to the present invention. As mentioned above, the runtime hardware layer 20 communicates with the runtime software layer 18 through the interface for tester abstraction. The ITA may comprise numerous ITA sub-blocks for programming associated instrument parameters. In the example of FIG. 6, ITA sub-interfaces include a DC-levels ITA, analog ITA, connect ITA, alarm ITA, trigger ITA, timing ITA, capture ITA, and a pattern ITA. The various ITA's are in communication with an associated instrument driver used to program particular instruments. The ITA configuration and resource controllers communicate with the instrument driver.

Figure 7:
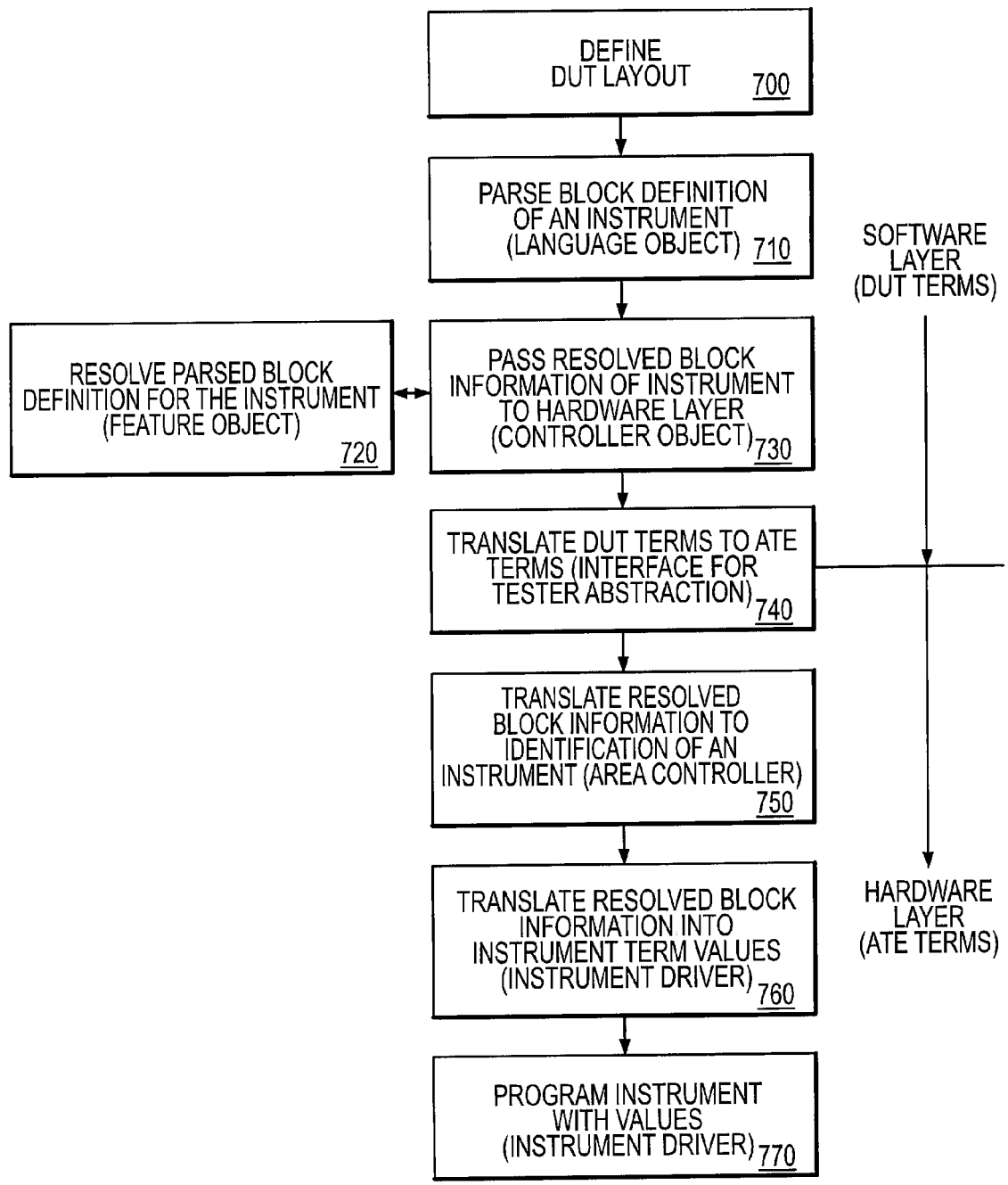
FIG. 7 is a flowchart illustrating operations involved in defining an instrument in abstract device terms and translating the instrument definition to abstract instrument terms via an interface for tester abstraction.

FIG. 7 is a flowchart illustrating the operations associated with establishing a definition in DUT terms, translating the definition into ATE terms, and programming an ATE instrument. For purposes of explanation and not limitations, the operations of FIG. 7 are referred to with regard to the examples set forth in the example code and tables 1–2 below. First, a user defines the device layout for a DUT through a mapping between the DUT and the ATE (operation 700). The following illustrates the mapping between DUT DBUS designations and slots of an ATE:

Signals:
    DBUS [0 . . . 2]=IO

Name Map:
    DBUS [0]=5.10=slotM.pogoN
    DBUS [1]=5.20=slotM.pogoN
    DBUS [2]=7.13=slotM.pogoN The "Signals" block establishes the DBUS designator as an input/ouput ("IO") signal involving pins 0, 1, and 2. The name map establishes a mapping between the DBUS[0], DBUS[1], and DBUS[2] designators and the instrument in slot M of the ATE. The "pogo" syntax refers to particular pins N or sockets of an ATE of the instrument in slot M. In the example set forth above, DBUS[1] is mapped to the instrument in slot 5 and pin 10, DBUS[2] is mapped to the instrument in slot 5 and pin 20, and DBUS[3] is mapped to the instrument in slot 7, pin 13. As such, the name map provides a mapping between the DUT terms of the data bus of the DUT and the ATE terms of an instrument that will pass and receive signals on the DUT data bus.

For testing the data bus designated "DBUS," various block types may be defined. In one example, the block definition is provided as a plug-in to allow easy addition and reconfiguration of block definitions. The following is XML code for one example of a DBUS "levels" block:

```
<Block = "Levels">
    <Name = "5V Nominal"/>
    <Sig/ "DBUS"/>
        <Vih = "Vcc*0.8"/>
        <Vil = 0.2/>
        <Voh = "Vcc/2 + 0.05"/>
        <Vol = "Vcc/2 - 0.05"/>
    </Sig>
</Block>
```

With reference to the instrument block diagram of FIG. 5, in the example DBUS levels block definition recited above, in DUT terms, the voltage level VIH of the input channel comparator is set at VCC*0.8 volts and the voltage level VIL of the input channel comparator is set at 0.2 volt. The voltage level VOH of the output channel comparator is set at VCC/2+0.05 volt and the voltage level VOL of the output channel comparator is set at VCC/2−0.05 volt. In this example, VCC is the reference voltage for a DUT. As such, via the levels block, the user defines the instrument comparator voltage levels in DUT terms, i.e., as a function of VCC for the DUT. All DBUS mappings refer to the DBUS levels defined in accordance with the code set forth above.

Next, the language object parses the block definition (operation 710). Table 1 below illustrates the parsed instrument voltage levels definition. The top row of the table is the parsed voltage level designators VIH, VIL, VOH, and VOL. The second row in corresponding columns, is the parsed equation definitions for the associated voltage level definitions. Thus, for example, column 1, row 1 has the voltage level definition designator VIH and corresponding column 1, row 2 has the corresponding definition of VCC*0.8.

TABLE 1

Sample of Parsed Block Definition by Language Object

| Vih | Vil | Voh | Vol |
|---|---|---|---|
| Vcc * 0.8 | 0.2 | Vcc/2 + 0.05 | Vcc/2 − 0.05 |

Next, under control of the controller object, the feature object resolves the parsed levels block (operation 720). The feature object has the parsed equations from the languate object. Table 2 below illustrates the resolved levels definitions for a value of VCC=5.0 volt. With a VCC value of 5 volts, VIH resolves to 4.0 volts, VIL resolves to 0.2 (not a function of VCC), VOH resolves to 2.55 volts, and VOL resolves 2.45.

TABLE 2

Sample of Resolved Block Definition by Feature Object

| Vih | Vil | Voh | Vol |
|---|---|---|---|
| 4.0 | 0.2 | 2.55 | 2.45 |

Next, the controller object receives the resolved levels information from the features object (operation 730). The fully resolved levels values may be stored in a cache available to the ITA. The controller object then passes the resolved instrument levels information in DUT terms to the ITA (operation 730), which begins the translation from the DUT terms to the ATE terms (operation 740). In the example set forth herein, the DUT terms information is translated to instrument terms to program the instrument for testing the particular DUT it will be connected to. As shown in FIGS. 3C and 6, the hardware layer comprises one or more area controllers and one or more instrument drivers. The area controllers work with the ITAs to translate fully resolved level designations received from the software layer to pin information that can be used by the instrument drivers (operation 750).

The following are generic ITA level pseudo-code commands implemented in the ITA:
    area=getarea ("AreaName");
    area.setX (rsrc, token, value);
    value.getx (rsrc, token);
    area.validateX (rsrc, token, value);

With reference to the DBUS example discussed with respect to the software layer, the command:
    mylevels=ITA.getArea ("Levels");

establishes a pointer to the DC levels ITA. The DC levels ITA translates the DUT terms information to ATE terms information for the DC levels. With respect to the DBUS definition, the following commands illustrate an example of the generic pseudo-code command of area.setx (rsrc, token, value):

mylevels.setD ("DBUS", "Vih", 4.0);
mylevels.setD ("DBUS", "Vil", 0.2);
mylevels.setD ("DBUS", "Voh", 2.55);
mylevels.setD ("DBUS", "Vol", 2.45);

These commands set the DBUS values for Vih, Vil, Voh, and Vol in the DC Levels ITA. More particularly, for the mylevels area, the DBUS resource (i.e., the pins associated with the DBUS mapping), are set with tokens of Vih, Vil, Voh, and Vol, respectively, and with values of 4.0, 0.2, 2.55, and 2.45, the resolved values for each DBUS token. As such, at this point, the DC Levels ITA has received resolved DBUS values in DUT terms.

The ITA includes an additional mapping construct to translate the DUT terms to ATE terms. As discussed above, a mapping is established between the DUT and the ATE via the signals definition and name map. As such, the DC levels ITA recognizes that:

DBUS=DUT Pins 0, 1, 2
DBUS [0, 1]=Instrument Type A Slot 5, Pins 10, 20
DBUS [2]=Instrument Type B Slot 7, Pin 13

As such, via the signals definition and name map mechanism, the ITA resolves DBUS pins 0, 1, and 2 (in DUT terms) to Instruments in slots 5 and 7 and pins (sockets) 10, 20, and 13, respectively (in ATE terms). Thus, for example, pin 10 of the instrument in slot 5 is coupled with DBUS pin 0 of the DUT.

Following, the identified instruments are set with the appropriate instrument term values (operation 760). For example, the instrument drivers may be set with the following commands.

Instrument Type A [slot 5] set D (pins 10+20, Vih, 4.0);
Instrument Type B [slot 7] set D (pins 13, Vil, 0.2);

Note, similar commands are used to set instruct pins with values associated with Vil, Voh, and Vol. The results of these commands are then used to program the instrument (operation 770). In one example, the set D commands set forth above cause the instrument driver to load particular hardware registers with values corresponding the Vih, Vil, Voh, and Vol values set forth above. For example, to program an instrument, the instrument drivers might include the following pseudo-code:

VIH=Reg Address 0X10
Register Value=Vih (Volt)/(0.01+512)
VIH register=Reg Val

As such, VIH is mapped to hardware register address 0X10. Register value is established in a format understandable to the instrument. In the above example, the "Register Value" operation converts the Vih voltage value of 4 volts, to a binary representation thereof.

Further, the resolved register value is stored in the VIH register for the target instrument. Thus, for example, the instrument in slot 5 will program Voltage input high of its output channel comparator at the value stored in register address 0X10.

Although various representative embodiments of this invention have been described above with a certain degree of particularity, those skilled in the art could make numerous alterations to the disclosed embodiments without departing from the spirit or scope of the inventive subject matter set forth in the specification and claims. In methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. An automatic testing equipment comprising:
a runtime software layer comprising indications of DUT pin information, the runtime software layer communicating in device under test terms;
a runtime hardware layer comprising indications of ATE instrument information, the runtime hardware layer communicating in automatic test equipment hardware terms;
an interface for translating the device under test terms from the runtime software layer to the automatic test equipment hardware terms of the runtime hardware layer;
a common access port in communication with the runtime software layer;
a hardware register interface in communication with the runtime hardware layer; and
a CORBA interface in communication with the common access port, the interface for tester abstraction, and the hardware register interface.

2. An automatic testing equipment comprising:
a runtime software layer comprising indications of DUT pin information, the runtime software layer communicating in device under test terms;
a runtime hardware layer comprising indications of ATE instrument information, the runtime hardware layer communicating in automatic test equipment hardware terms;
an interface for translating the device under test terms from the runtime software layer to the automatic test equipment hardware terms of the runtime hardware layer;
a common access port in communication with the runtime software layer;
a hardware register interface in communication with the runtime hardware layer; and
a java native interface in communication with the common access port, the interface for test abstraction, and the hardware register interface.

3. An automatic testing equipment comprising:
a runtime software layer comprising indications of DUT pin information, the runtime software layer communicating in device under test terms;
a runtime hardware layer comprising indications of ATE instrument information, the runtime hardware layer communicating in automatic test equipment hardware terms;
an interface for translating the device under test terms from the runtime software layer to the automatic test equipment hardware terms of the runtime hardware layer; and
wherein the runtime software area comprises at least one language object, at least one controller object, and at least one features object.

4. An automatic testing equipment comprising:
a runtime software layer comprising indications of DUT pin information, the runtime software layer communicating in device under test terms;
a runtime hardware layer comprising indications of ATE instrument information, the runtime hardware layer communicating in automatic test equipment hardware terms;

an interface for translating the device under test terms from the runtime software layer to the automatic test equipment hardware terms of the runtime hardware layer; and wherein the runtime hardware area comprises at least one area controller and at least one instrument driver.

5. An automatic testing equipment comprising:

a runtime software layer comprising indications of DUT pin information, the runtime software layer communicating in device under test terms;

a runtime hardware layer comprising indications of ATE instrument information, the runtime hardware layer communicating in automatic test equipment hardware terms;

an interface for translating the device under test terms from the runtime software layer to the automatic test equipment hardware terms of the runtime hardware layer; and wherein the interface for translating the device under test terms comprises:

a DC-levels interface, an analog interface, a connection interface, an alarm interface, a trigger interface, a timing interface, a capture interface, and a pattern interface.

* * * * *